Figure 1:
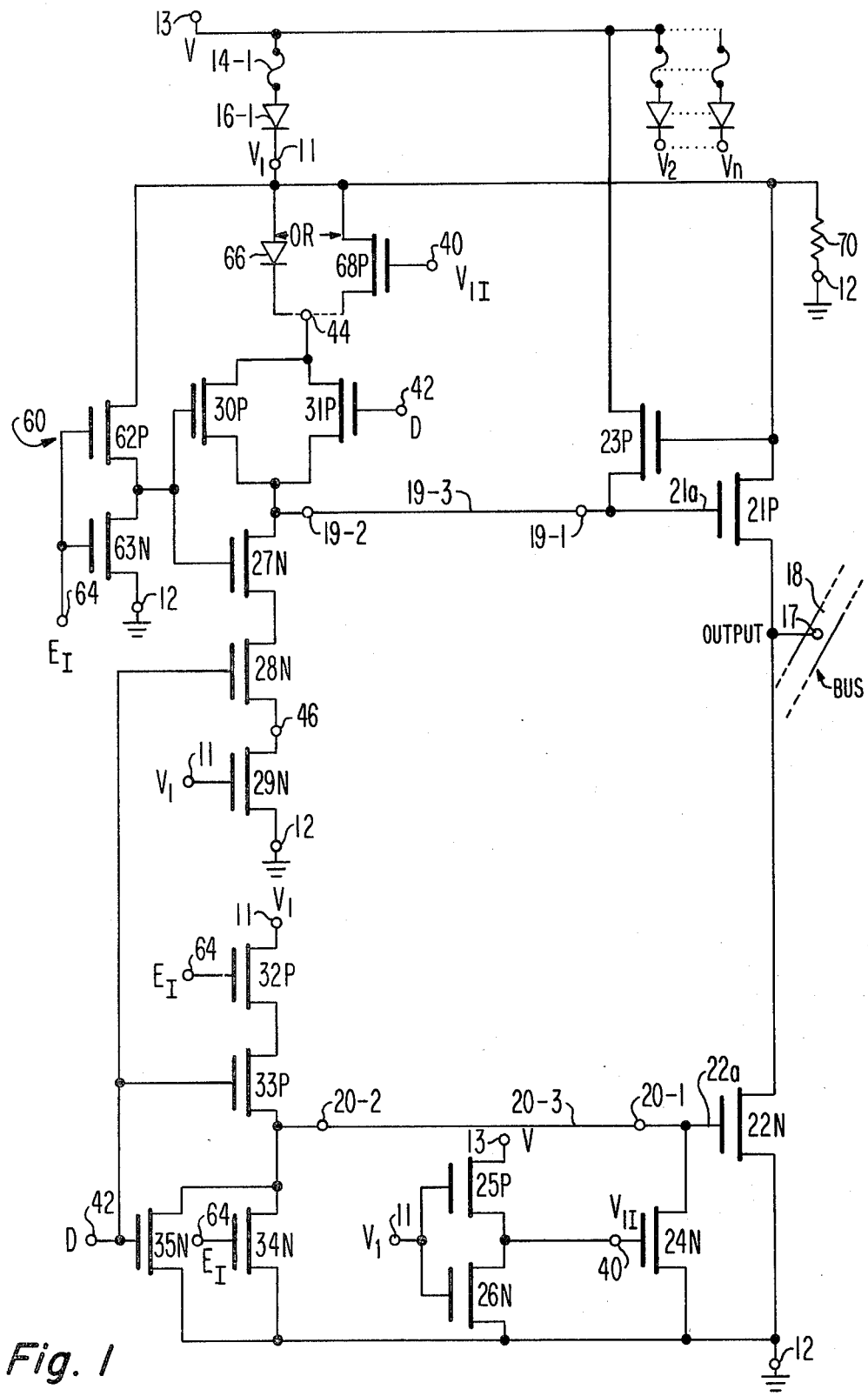

United States Patent [19]

Smith

[11] 4,425,517

[45] Jan. 10, 1984

[54] FAIL SOFT TRI-STATE LOGIC CIRCUIT

[75] Inventor: Allan M. Smith, Moorestown, N.J.

[73] Assignee: RCA Corporation, New York, N.Y.

[21] Appl. No.: 249,608

[22] Filed: Mar. 31, 1981

[51] Int. Cl.³ ................. H03K 19/007; H03K 19/003; H03K 19/092; H03K 19/094

[52] U.S. Cl. .................................... 307/473; 307/442

[58] Field of Search ............... 307/442, 443, 473, 270, 307/200 B; 365/226, 228

[56] References Cited

U.S. PATENT DOCUMENTS

| | | | |
|---|---|---|---|
| 4,280,065 | 7/1981 | Minato et al. | 307/270 |
| 4,329,600 | 5/1982 | Stewart | 307/473 |
| 4,363,978 | 12/1982 | Heimbigner | 307/473 |

OTHER PUBLICATIONS

Drawing No. 978964, Sheet 28, by Raytheon Company.

*Primary Examiner*—Stanley D. Miller
*Assistant Examiner*—David R. Bertelson

*Attorney, Agent, or Firm*—J. S. Tripoli; R. L. Troike; R. E. Smiley

[57] ABSTRACT

A tri-state logic circuit which, upon failure of its operating potential, produces a high impedance between its output terminals. The tri-state logic circuit includes first and second complementary conductivity type transistors each with a control electrode and with a conduction path. The paths are connected in series to the operating potential. The control electrode of the first transistor is connected to an intermediate point in a series switching circuit the ends of which are connected to the operating potential. The series circuit is responsive to the presence of the operating potential and to binary data and control signal inputs of given values for causing the conduction path of the first transistor to assume a low impedance state. The series circuit also includes on both sides of said intermediate point devices responsive to a loss in the operating potential for causing the first transistor to assume a high impedance state irrespective of the value of the data and control signals.

6 Claims, 2 Drawing Figures

FAIL SOFT TRI-STATE LOGIC CIRCUIT

The Government has rights in this invention pursuant to Subcontract No. 53-0075-SZ-98005 under prime contract No. F04701-75-C-0149 awarded by the Department of the Air Force to Raytheon Corp.

This invention relates to logic circuits and particularly to tri-state logic circuits employing complementary transistors.

A tri-state logic circuit of the type of interest here is one having an output terminal that can assume one of three states. It can supply current to a load in a first state, it can sink current from a load in a second state, or it can assume an isolated (floating or high impedance) condition in a third state. Such circuits are useful, for example, in digital applications where it is desired to connect the outputs of a number of system logic elements such as memory units, central processors, or input/output processors, to a common data bus.

Tri-state logic circuits and other circuits connected thereto require one or more power supplies for their proper operation. Power from the power supply can be interrupted for a number of reasons, both intentional and unintentional. When the power fails, it is esential that all affected tri-state logic circuits are caused to achieve the aforementioned high impedance state so as not to load the common bus. A tri-state logic circuit which achieves the high impedance condition upon power failure is known as a fail soft tri-state logic circuit.

In one prior art fail soft tri-state circuit, fourteen devices, such as transistors, are used to achieve the fail soft feature. This prior art system will be described briefly in connection with a description of the inventive circuit.

In accordance with a preferred embodiment of the present invention, only four devices (four transistors or three transistors and one diode) are required to perform the same fail soft function. In accordance with a preferred embodiment of the invention the fail soft tri-state circuit comprises first and second complementary conductivity type transistors each having a conduction path which paths are connected in series between terminals to which an operating potential may be applied and also having a control electrode and further including first means coupled to the control electrode of the first transistor and responsive to the presence of data and control binary signals for causing the first transistor to achieve a high or a low impedance in its conduction path, depending on the value of the data and control signals. The circuit further includes second means coupled in series with the first means and terminals to which the operating potential may be applied and responsive to the absence of operating potential for inhibiting the first transistor from achieving its low impedance state irrespective of the values of data and control signals.

Figure 2:
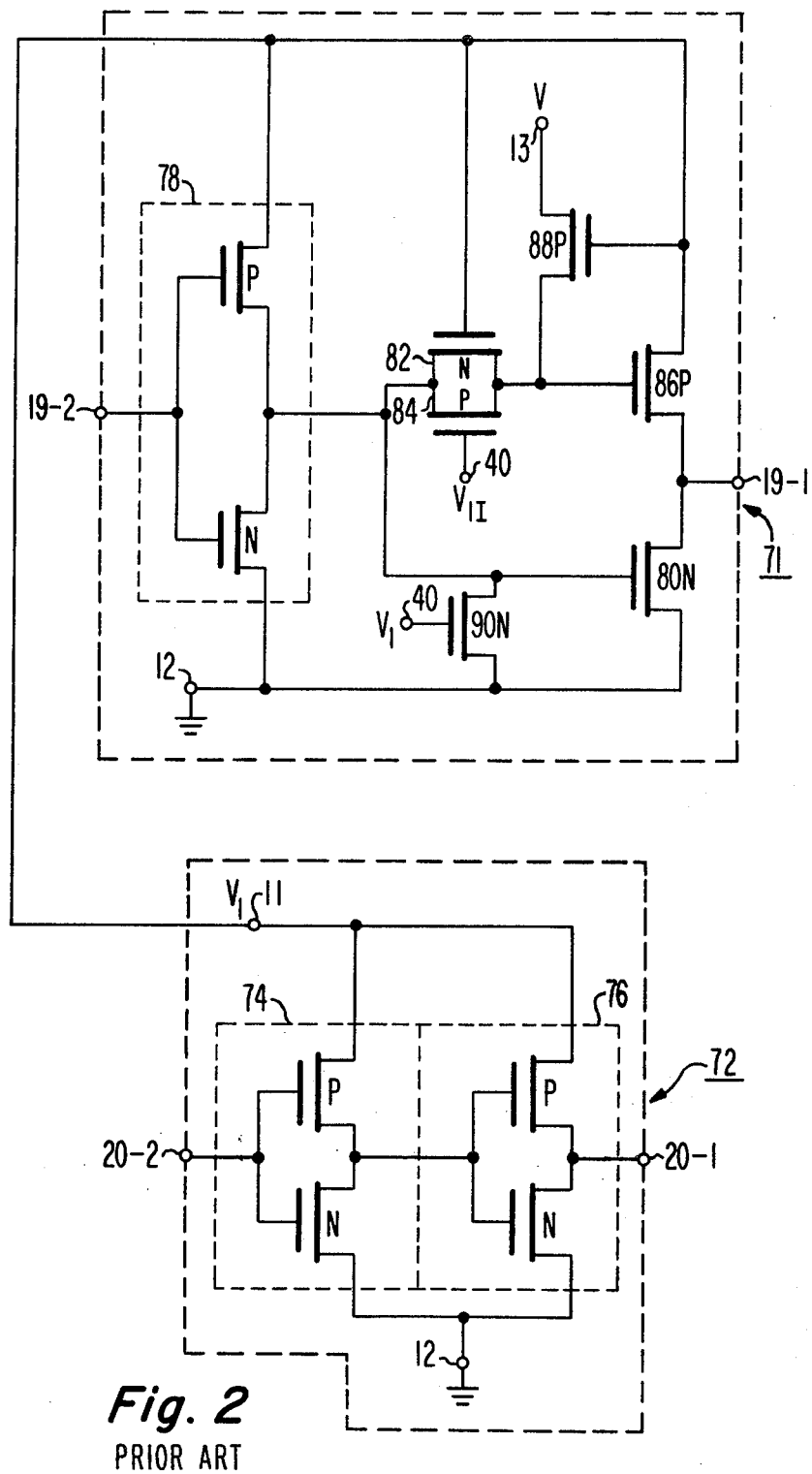

In the drawing:

FIG. 1 is a schematic diagram of a fail soft tri-state logic circuit in accordance with the present invention; and FIG. 2 is a schematic diagram of a portion of a tri-state logic circuit in accordance with the prior art.

With reference to FIGS. 1 and 2 all transistors are marked with P or N where P indicates a P-channel enhancement mode MOSFET device and N indicates an N-channel enhancement mode MOSFET device. It is to be understood, of course, that different conductivity type transistors and different supply potentials could be used instead. Further, the logic convention adopted here is that a positive voltage corresponds to binary 1 and a ground level voltage corresponds to binary 0. Terminals 11 and 13 are maintained at first and second positive supply potentials, respectively, while terminal 12 is at circuit ground. Several terminal numbers are duplicated at different places in the drawing FIGURES to avoid the necessity of long lead lines.

Referring now to FIG. 1, a master power supply (not shown) of potential V is connected between terminals 13 (positive) and 12 (negative). A fuse 14-1 and diode 16-1 are series connected between terminal 13 and terminal 11, which is at potential $V_1$, of the tri-state logic device illustrated in FIG. 1. In a similar manner potentials $V_2 \ldots V_n$ are supplied to other tri-state logic circuits (not shown). More than one tri-state logic circuit as well as other logic circuits (not shown) may receive power at potential $V_1$. The conduction paths of first and second transistors 21 and 22 are connected in series between terminal 11 and 12. The electrical midpoint of the series connection between transistors 21 and 22 is connected to an output terminal 17 which in turn is connected to a bus 18 to which other tri-state logic circuits (not shown) which receive power at terminal $V_2 \ldots V_n$ are also connected.

The control terminal or gate 21a of transistor 21 is connected to terminal 19-1 while the control terminal or gate 22a of transistor 22 is connected to a terminal 20-1. Since transistor 21 is a P-channel device, a ground level voltage applied to terminal 19-1 will cause transistor 21 to be turned on, thus clamping the output terminal 17 to $+V_1$ volts. Conversely, if the voltage supplied to terminal 19-1 is a positive voltage, transistor 21 will present a high impedance between output terminal 17 and ground 12. Similarly, a positive voltage applied at terminal 20-1 will cause transistor 22 to be conductive, clamping output terminal 17 to ground while if a ground level voltage is applied at terminal 20-1, transistor 22 will exhibit a high impedance between terminal 17 and terminal 12.

The conduction path of a third transistor 23 extends between terminal 13 and terminal 19-1. The gate of transistor 23 is connected to terminal 11. The conduction path of a fourth transistor 24 extends between terminal 20-1 and terminal 12.

The conduction of path of fifth and sixth transistors 25 and 26 are connected between terminal 13 and terminal 12. The juncture of the conductive paths of transistors 25 and 26 is connected to a terminal 40 which is connected to the gate of transistor 24. The gates of transistors 25 and 26 are connected in common to terminal 11. Transistors 25 and 26 in combination act as an inverter such that when voltage $V_1$ is present at terminal 11, terminal 40 is at ground. Conversely, when $V_1$ is at ground such as due to a failure of fuse 14-1, terminal 40 is at a voltage level V.

The conduction paths of seventh, eight and ninth transistors 27, 28 and 29 are connected between terminal 19-2 and terminal 12. The gate of transistor 29 is connected to terminal 11. The gate of transistor 28 is connected to a terminal 42, also marked terminal D, to which binary data signals are applied. The data signals are either at ground corresponding to a binary 0 or at voltage V corresponding to a binary 1.

The conduction paths of tenth and eleventh transistors 30 and 31 are connected in parallel between terminals 44 and 19-2. The gate of transistor 31 is connected to terminal 42. The gates of transistors 30 and 27 are connected to the output of an inverter 60 comprising transistors 62 and 63, having their conductive paths series connected between terminal 11 and terminal 12. The gates of transistors 62 and 63 are coupled to terminal 64, also labeled $E_I$. Terminal 64 receives an enable signal which is of binary value 0 when the tri-state circuit of FIG. 1 is to be enabled and is otherwise a logic 1.

A means for passing current from terminal 11 to terminal 44 only when potential $V_1$ is present may be either of a diode 66 or a transistor 68 coupled between terminal 11 and terminal 44. If a transistor 68 is used its gate is coupled to terminal 40 to receive potential $V_{11}$ thereat.

The conductive path of transistors 32 and 33 are series connected between terminal 11 and terminal 20-2. The gate of transistor 33 is connected to terminal 42 to receive the data binary signal thereat while the gate of transistor 32 is connected to terminal 64 to receive the enable signal thereat. The conduction path of transistors 34 and 35 are connected in parallel between terminals 20-2 and 12. The gate of transistor 34 is connected to terminal 64 while the gate of transistor 35 is connected to terminal 42. A resistor 70 is connected between terminals 11 and 12 and typically may be on the order of 30,000 ohms.

A conductor 19-3 connects terminals 19-1 and 19-2, while a second conductor 20-3 connects terminals 20-1 and 20-2. The purpose of the terminals will be explained in connection with the explanation of a prior art circuit illustrated in FIG. 2. Similarly, a terminal 46 interposed between the conductive paths of transistors 28 and 29 is for the purpose of enabling the explanation of the prior art circuit.

Operation of the circuit of FIG. 1 will now be described, assuming first that voltage $V_1$ is present. The following truth table represents signals appearing at output terminal 17 for given input signals at terminals 19-1 and 20-1 where, as before, a logic 0 corresponds to a ground potential while a logic 1 corresponds to potential $V_1$.

| Line | Terminal 19-1 | Terminal 20-1 | Terminal 17 |
|------|---------------|---------------|-------------|
| 1 | 0 | 0 | 1 |
| 2 | 1 | 1 | 0 |
| 3 | 1 | 0 | high impedance |
| 4 | 0 | 1 | invalid states |

With the conditions specified in Line 4, fuse 14-1 will likely blow or open because both transistors 21 and 22 are conductive, thus attempting to place terminal 17 at both ground at $V_1$ volts.

The following truth table represents signals at terminals 19-2, 20-2 and 17 with input signals at terminals 42(D) and 64($E_I$) as indicated in the truth table.

| Terminal 64 | Terminal 42 | Terminal 19-2 | Terminal 20-2 | Terminal 17 |
|-------------|-------------|---------------|---------------|-------------|
| 1 | 0 | 1 | 0 | high impedance |
| 1 | 1 | 1 | 0 | high impedance |
| 0 | 0 | 1 | 1 | 0 |
| 0 | 1 | 0 | 0 | 1 |

That is, with $E_I$ at logic 1, terminal 17 is at a high impedance regardless of the value of the data input at terminal 42; with $E_I$ at logic 0 terminal 17 is at the same logic value as that of the data.

If voltage $V_1$ should fail as by the opening of fuse 14-1 or the intentional removal of voltage $V_1$ to allow maintenance to be performed, voltage $V_1$ will approach ground because of the current flow through resistor 70. With the loss of voltage $V_1$ transistor 25 is conductive, while transistor 26 is non-conductive such that voltage $V_{1I}$ at terminal 40 will be substantially at the level of voltage V appearing at terminal 13. When voltage V (logic 1) is applied to the gate of transistor 24 the transistor becomes conductive causing a logic 0 to appear at terminal 20-1 such that transistor 22 is rendered non-conductive. The logic level applied to terminal 20-1 by transistor 24 is ensured because with voltage $V_1$ failed it is not possible for terminal 20-2 to be at a logic 1 level.

When $V_1$ drops below V by some amount, depending on the characteristics of transistors 23, 24, 25 and 26, transistor 23 will become conductive placing a logic 1 at terminal 19-1 and therefore causing transistor 21 to become non-conductive. Although transistor 23 attempts to force terminal 19-1 to a logic 1 level is possible, in the absence of components 29 and 66 or 68, for terminal 19-2 to be at a logic 0 level. Thus, assuming that terminal 46 is connected directly to terminal 12 and that terminal 44 is connected directly to terminal 11 and if transistors 27 and 28 are conductive by virtue of logic 1's being applied to their gates, then terminal 19-2 and thus terminal 19-1 would tend to be forced to a ground or logic 0 condition which could result in failure of component 23 and thus terminal 19-1 achieving a ground condition which would render transistor 21 conductive, an intolerable situation. Also, if either transistor 30 or transistor 31 are made conductive, such as by logic 0 signals being applied to their gates, the low voltage which will be attained by terminal 11 as power is dissipated through resistor 70 will cause terminal 19-2 and therefore terminal 19-1 to become a logic 0, again resulting in the same intolerable condition as described before.

In accordance with the invention, however, transistor 29 is present such that, upon failure of voltage $V_1$, transistor 29 is rendered non-conductive, thereby providing a high impedance through the path from terminal 12 to terminal 19-2. Further, in the case of diode 66 there is no current flow as $V_1$ tends to go to ground from terminal 11 through either transistor 30 or transistor 31 to terminal 19-2. Therefore no undesirable logic 0 can occur at terminal 19-1 as above described. Similarly, if transistor 68 is utilized when voltage $V_1$ fails, voltage $V_{1I}$ is substantially at potential V and transistor 68 is rendered non-conductive.

Thus, in summary the fail soft feature is provided by just four components, 23, 24, 29 and either 66 or 68.

In contrast to the four devices required in the present invention for providing a fail soft tri-state circuit, in the prior art the elements illustrated in FIG. 2 to which attention is now directed are required. That is, circuit 71 of FIG. 2 is substituted in place of jumper 19-3 in FIG. 1, while circuit 72 of FIG. 2 is substituted in place of conductor 20-3 in FIG. 1. FIG. 1 is further modified in the prior art by the substitution of a jumper wire between terminals 11 and 44 to replace device 66 or 68 and the replacement of device 29 with a jumper wire extending between terminal 46 and terminal 12. Circuit 72 essentially comprises two inverters 74 and 76 indicated within respective dashed boxes and simply provides for a delay equal to the delay through circuit 71. Circuit 71 comprises an inverter 78 connected at its input between terminal 19-2 and at its output to the gate of device 80 and to the conductive path of the parallel combination of devices 82 and 84. The conductive path of devices 82 and 84 are connected to the gate of device 86. The conductive path of the device 88 is connected between the gate of device 86 and terminal 13 while its gate is connected to terminal 11. The conductive path of a device 90 is connected between terminal 12 and the gate of device 80. The gate of a device 90 is connected to terminal 40. A detailed description of FIG. 2 will not be given, but essentially its purpose is the same as that of the circuit of FIG. 1; that is, to make sure that should a failure of voltage $V_1$ occur a high impedance is produced at terminal 19-1 and both transistors 21 and 22 are rendered non-conductive. In contrast to the four components required for a fail soft condition in FIG. 1, namely components 23, 24, 29 and either 66 or 68, the circuit of FIG. 2 requires fourteen components, namely devices 23 and 24 in FIG. 1 and the twelve additional devices illustrated in FIG. 2.

What is claimed is:

1. A tri-state device having a data input terminal and a control input terminal, each for receiving binary valued input signals, an output terminal, and first and second voltage input terminals across which may be impressed an operating potential which is subject to failure, said device comprising:

a first pair of first and second complementary conductivity type transistors, each having a conduction path and a control electrode, said first and second transistors having their conduction paths series connected between said first and second voltage input terminals and wherein the electrical midpoint of said series connection is connected to said output terminal;

first means coupled to said control electrode of said second transistor and responsive to the presence of said operating potential and to the signal applied at said data and control terminals for causing said second transistor conduction path to exhibit a low impedance when said data and control terminals are receptive of given respective binary values and to otherwise exhibit a high impedance;

second means also coupled to said control electrode of said second transistor and responsive to the absence of said operating potential between said first and second input voltage terminals for forcing said second transistor to exhibit said high impedance through its conduction path regardless of the values at the data and control terminals;

third means coupled to the control electrode of said first transistor and responsive to the presence of said operating potential at said first and second voltage input terminals and to data and control signals applied to said data and control terminals for causing said first transistor to exhibit a low impedance when said data and control terminals are receptive of given respective binary values and to otherwise exhibit a high impedance;

fourth means also coupled to said first transistor control electrode and responsive to the absence of said operating potential for forcing said first transistor to its high impedance state;

wherein said third means includes third, fourth, and fifth transistors of conductivity type complementary to that of said first transistor, each having a conduction path and a control electrode, said conduction paths being series connected between said second voltage input terminal and first transistor control electrode, said control electrodes of said third and fifth transistors being connected to said data and first voltage input terminals, respectively, said control electrode of said fourth transistor being coupled to receive a signal which is a function of the signal applied to said control input terminal, said third, fourth and fifth transistors being responsive to the loss of potential between said first and second voltage input terminals for creating a high impedance in the conductive path of said series connected third, fourth and fifth transistors;

sixth and seventh transistors of the same conductivity type as said first transistor, each having a conduction path and a control electrode, said conduction paths of said sixth and seventh transistors being connected in parallel, said control electrode of said sixth transistor being connected to said data input terminal, said control electrode of said seventh transistor being coupled to receive a signal which is a function of the signal applied to said control terminal; and means for passing current to the conduction path of said sixth and seventh transistors only when voltage is present between said first and second voltage input terminals and having first and second terminals, said first terminal being connected to said first voltage terminal, said conduction paths of said sixth and seventh transistors being connected in parallel between said first transistor control electrode and said second terminal of said means for passing current.

2. A tri-state logic device comprising in combination:

first and second circuit points across which a first operating potential may be applied;

a third circuit point to which in combination with said second circuit point a second operating potential may be applied;

a control terminal for receiving a binary valued signal;

a data terminal for receiving a binary valued signal;

a circuit output terminal;

first and second transistors of complementary conductivity types each having a conduction path and a control electrode, the conduction paths being connected in series between said first and second circuit points, the electrical midpoint of the series conduction path being connected to said circuit output terminal;

means coupling said data terminal and said control terminal to said second transistor control electrode;

a third transistor of the same conductivity type as said first transistor having its control terminal connected to said first circuit point and having its conduction path extending between said third circuit point and first transistor control elecgtrode;

a fourth transistor of the same conductivity type as said second transistor, having a control electrode, and having its conduction path connected between said second circuit point and said control electrode of said second transistor;

fifth and sixth transistors of complementary conductivity types having conduction paths series connected between said third circuit point and second circuit point, the electrical midpoint of the series connection being connected to said fourth transistor control electrode, the control electrodes of said fifth and sixth transistors being connected to said first circuit point;

seventh, eighth, and ninth transistors of conductivity type the same as said second transistor having their conductive paths in series connected between said first transistor control electrode and said second circuit point, the control electrodes of said eighth and ninth transistors being connected to said data terminal and said first circuit point, respectively, said control electrode of said seventh transistor being coupled to receive a signal which is a function of the signal applied to said control terminal;

tenth and eleventh transistors of the same conductivity type as said first transistor, the control electrode of said eleventh transistor being connected to said data terminal, said control electrode of said tenth transistor being coupled to receive a signal which is a function of the signal applied to said control terminal; and means for passing current to the conduction path of said tenth and eleventh transistors only when said first operating potential is present between said first and second circuit points, said means having two terminals, one of which is connected to said first circuit point, the conduction paths of said tenth and eleventh transistors being connected in parallel between said first transistor control electrode and the other terminal of said means for passing current.

3. The combination as set forth in either claim 1 or claim 2 wherein said means for passing current is a diode.

4. The combination as set forth in either claim 1 or claim 2 wherein said means for passing current comprises a transistor of the same conductivity type as said first transistor.

5. The combination as set forth in claim 1 wherein said means for passing current comprises an eighth transistor having a control electrode and having a conduction path coupled in series with the conduction paths of said sixth and seventh transistors and further comprising means responsive to an operating potential between said first and second voltage terminals for causing said eighth transistor to pass current therethrough only when said operating potential is present.

6. The combination as set forth in claim 2 wherein said means for passing current comprises a twelfth transistor having a control electrode and having a conduction path coupled in series between the conduction path of said tenth and eleventh transistors and said first circuit terminal and having its control electrode coupled to the electrical midpoint of the conduction path of said fifth and sixth transistors.

* * * * *